(12) United States Patent
Chen et al.

(10) Patent No.: US 8,789,438 B2
(45) Date of Patent: Jul. 29, 2014

(54) SPACE CURVE MESH DRIVING PAIR AND POLYHEDRAL SPACE CURVE MESH TRANSMISSION

(75) Inventors: Yangzhi Chen, Guangdong (CN); Zhen Chen, Guangdong (CN); Jiang Ding, Guangdong (CN)

(73) Assignee: South China University of Technology, Guangdong (CN)

( * ) Notice: Subject to any disclaimer, the term of this patent is extended or adjusted under 35 U.S.C. 154(b) by 108 days.

(21) Appl. No.: 13/575,624

(22) PCT Filed: Nov. 1, 2010

(86) PCT No.: PCT/CN2010/078294
§ 371 (c)(1),
(2), (4) Date: Aug. 2, 2012

(87) PCT Pub. No.: WO2011/091676
PCT Pub. Date: Aug. 4, 2011

(65) Prior Publication Data
US 2013/0145876 A1 Jun. 13, 2013

(30) Foreign Application Priority Data

Jan. 29, 2010 (CN) .......................... 2010 1 0105902
Oct. 19, 2010 (CN) .......................... 2010 1 0511625

(51) Int. Cl.
| | | |
|---|---|---|
| F16H 55/00 | (2006.01) | |
| F16H 1/12 | (2006.01) | |
| F16H 1/20 | (2006.01) | |
| B81B 5/00 | (2006.01) | |
| F16H 55/08 | (2006.01) | |
| F16H 1/24 | (2006.01) | |
| F16H 37/06 | (2006.01) | |

(52) U.S. Cl.
CPC .. *F16H 1/12* (2013.01); *B81B 5/00* (2013.01); *B81B 2201/037* (2013.01); *F16H 55/0853* (2013.01); *F16H 37/065* (2013.01); *F16H 1/24* (2013.01)
USPC ............................................. 74/462; 74/416

(58) Field of Classification Search
CPC .......... F16H 55/17; F16H 1/08; F16H 55/16; F16H 55/08; F16H 1/20; F16H 1/24; F16H 1/222

USPC ..................................... 74/416, 434, 457, 462
See application file for complete search history.

(56) References Cited

U.S. PATENT DOCUMENTS

| | | | | |
|---|---|---|---|---|
| 779,165 | A * | 1/1905 | Junghens .......................... 74/416 |
| 3,701,287 | A * | 10/1972 | Kuiken ............................ 74/462 |
| 3,851,540 | A * | 12/1974 | Tutiya .............................. 74/437 |
| 7,036,392 | B2 * | 5/2006 | Eldally ............................ 74/437 |
| 2010/0074786 | A1 * | 3/2010 | Juan et al. ..................... 418/195 |

FOREIGN PATENT DOCUMENTS

CN 101324265 A * 12/2008

OTHER PUBLICATIONS

Translation of CN101324265A1. Jul. 2008.*

* cited by examiner

*Primary Examiner* — Justin Krause
(74) *Attorney, Agent, or Firm* — Nixon Peabody LLP; Jeffrey L. Costellia

(57) ABSTRACT

A space curve mesh driving pair and a polyhedral space curve mesh transmission are disclosed. Said space curve mesh driving pair consists of a driving wheel and a driven wheel. Axes of the driving wheel and the driven wheel are intersected at an angle of 0°~180°, and power transmission is realized by continuous mesh between the driving tines and the driven tines; a number of driving tines are provided on said driving wheel, and a number of driven tines are provided on the driven wheel; the driving tines are uniformly arranged on an end face of a cylinder of the driving wheel, and the driven tines are uniformly arranged on the circumference of a cylindrical surface of the driven wheel. Said polyhedral space curve mesh transmission consists of an above-mentioned space curve mesh driving pair. Motion is input from an input end, and is passed through a number of pace curve mesh driving pairs to realize the speed change, then is output from one or more output ends. Wherein, the space curve mesh driving pair is the core of the transmission. The invention has the advantages of compact structure, small size, light weight, stable transmission and flexible operation, and can be widely used in micromechanism field.

5 Claims, 7 Drawing Sheets

SPACE CURVE MESH DRIVING PAIR AND POLYHEDRAL SPACE CURVE MESH TRANSMISSION

TECHNICAL FIELD

The invention relates to a gear transmission mechanism of micro-mechanism, in particular relates to a space curve mesh driving pair and a polyhedral space curve mesh transmission.

TECHNICAL BACKGROUND

The development of modern society promotes the rapid development of the mini-machines (1~100 mm) and micro-machines (10 um~1 mm), and micro-machines become one of mechanical frontiers. The core function of the micro-machines and micro-machines is to realize the transmission of low power and continuous motion in a tiny space.

The innovation research on working principle, performance characteristic and design and manufacture of the drive mechanism of micro-mechanism has been one of the important directions of the mechanical science frontier research field. In addition, the gear drive is a drive technology which is most widely used, and gears have formed an independent industry system, which is one of the important bases of the mechanical industry or even the modern industry and will accompany with the whole developing process of the industrial civilization. The design and manufacturing technology of new high-performance gear mechanisms is always one of the key research fields of the mechanical industry. As the most important characteristic of the tiny/micro mechanical and electronic products is small volume (which requires a small space of the drive mechanism and the drive system) and light weight, most of which primarily are based on the low power transmission or dividing movement rather than high power transmission, so that drive mechanisms (such as gear, chain, belt, connecting rod) widely applied in conventional industries usually are not suitable for this kind of products. Hence the key technology of the micro mechanical and electronic system field is to realize a drive method and mechanism for micro-machines.

All developed countries have vigorously carried out researches on the drive technology of micro-machines and made great achievements; in recent years, the drive technology of micro-machines has been widely applied. At present the drive technologies of micro-machines researched and developed by countries in the world mainly comprise:

(1). Mechanical drive technology by directly microminiaturizing drive mechanisms of the conventional mechanisms. For example, micro mechanical drive mechanisms such as micro-pump mechanism, micro-spring mechanism, micro-flow valve mechanism, micro-gear train mechanism, micro-parallel mechanism, micro-ratchet mechanism, micro-hydraulic drive mechanism. To directly microminiaturize drive mechanisms of the conventional mechanisms has some obvious disadvantages. For example, micro cylindrical gears have high requirements on manufacture and installation accuracy, have high costs and cannot realize the drive between the perpendicularly intersecting shafts; micro bevel gear drive cannot realize great transmission ratio, meanwhile the micro bevel gears are more difficult to be manufactured and installed; the micro-friction wheel drive needs an additional positive pressure applying device, has a complex structure, causes deformation of the shaft system and intensifies the friction and wear; the micro-worm drive takes an oversize space as the axes of the worm wheel and the worm are not in the same plane; the micro-screw drive has a low efficiency, causes wear easily and has crawling phenomenon at a low speed, etc.

(2) Micro-drive technology of non-conventional mechanisms. For example, electrothermal drive, giant magnetic and elastic drive, electroplating micro-drive, shape memory alloy (SMA) drive, heat mechanical drive, magnetic fluid drive, piezoelectric drive, artificial muscle drive based on non-pre-strain and non-conductive elastomer, micro-impact drive mechanism by exciting laser with lights etc. Among these non-mechanical micro-drive technologies, some have been applied in the industry, particularly the piezoelectric drive technology has been greatly applied in the industry. However, some have complex structures, are expensive and have unstable performances. The most important characteristic of the micro-drive technology of the non-conventional mechanisms is that it is only suitable for realizing small displacement or instantaneously triggering or intermittent drive of a micro power, and most of them are being studied.

(3) Combined or comprehensive micro-drive technology. For example, micro-macro or combining with connecting rod micro-drive; hybrid drive of gas drive and giant magnetostriction drive, etc.

(4) Drive mechanism of micro-machines by fundamental theory innovating based on drive mechanisms of the conventional mechanisms. In order to realize the micro power in a tiny space or continuous drive of the motion, as well as overcoming a series of problems caused by directly micro-miniaturzing the conventional drive mechanism, many scholars carried out fundamental theory innovation based on the drive mechanisms of the conventional mechanisms to research a new micro-drive mechanism. The research on the drive mechanisms of the micro-machines has originality features and belongs to one of the latest research fields at present.

SUMMARY OF THE INVENTION

The invention relates to a space curve mesh driving pair in view of the disadvantages of the prior art in this filed, then further relates to a polyhedral space curve mesh transmission on this basis; the technical proposals of the invention are as follows.

A space curve mesh driving pair consists of a driving wheel and a driven wheel, wherein axes of the driving wheel and the driven wheel are intersected at an angle of 0°~180°. The driving wheel is connected with an input shaft, the driven wheel is connected with an output shaft, and power transmission is realized by a continuous mesh effect between driving tines (or referred to as driving cant hooks) and driven tines (or referred to as driven cant hooks).

In above-mentioned space curve mesh driving pair, a number of driving tines are provided on said driving wheel, and a number of driven tines are provided on the driven wheel; the driving tines are uniformly arranged on an end face of a cylinder of the driving wheel, and the driven tines are uniformly arranged on the circumference of a cylindrical surface of the driven wheel; the driving wheel and the driven wheel forms a driving pair, when the driving wheel rotates, the driving tines mesh with the driven tines to realize the transmission between the space intersecting axes.

In above-mentioned space curve mesh driving pair, the central lines of said driving tines are space helical lines, the central lines of the driven tines are conjugate with the central lines of the driving tines.

In above-mentioned space curve mesh driving pair, one of the driving tines meshes with one of the driven tines, when the mesh is about to separate but the mesh is not separated completely, another driving cant hook and another driven cant hook continue participating the mesh so as to ensure the space curve mesh driving pair to realize a continuous and stable mesh transmission.

In above-mentioned space curve mesh driving pair, the equations of the central lines of said driven tines and the central lines of said driving tines are determined by the following method: in two space Cartesian coordinate systems of o-x,y,z and $o_p$-$x_p$,$y_p$,$z_p$, O is the origin of the coordinate system o-x,y,z , $O_p$ is the origin of the coordinate system $o_p$-$x_p$,$y_p$,$z_p$; axis z overlaps with the axis of the driving wheel, axis $Z_p$ overlaps with the axis of the driven wheel, plane xoz and plane $x_p o_p z_p$ are in the same plane; the included angle between plane $x_p o_p y_p$ and plane x o y is θ, and $0° \leq \theta \leq 180°$; the distance from point $O_p$ to axis z is a, the distance to axis x is b; space Cartesian coordinate system $o_1$-$x_1$,$y_1$,$z_1$ is fixedly connected with the driving wheel, space Cartesian coordinate system $o_2$-$x_2$,$y_2$,$z_2$ is fixedly connected with the driven wheel, they overlap with the coordinate system o-x,y,z and $o_p$-$x_p$,$y_p$,$z_p$ at the original position; the driving wheel rotates at a uniform angular velocity $\omega_1$ around axis z, the driven wheel rotates at a uniform angular velocity $\omega_2$ around axis $Z_p$; after a period of time from the original position, the coordinate systems $o_1$-$x_1$,$y_1$,$z_1$ and $o_2$-$x_2$,$y_2$,$z_2$ rotate respectively, at this moment the driving wheel turns angle $\phi_1$ around axis Z, the driven wheel turns angle $\phi_2$ around axis $Z_p$.

Then the space curve equations of the central lines of the driving tines and the central lines of the driven tines can be expressed as:

$$\begin{cases} \left[-\sin\phi_1\left(x_1 - \frac{D}{2}\beta_{x1}\right) + \cos\phi_1\left(y_1 - \frac{D}{2}\beta_{y1}\right)\right](\omega_1 - \omega_2\cos\theta) \\ (\cos\phi_1\beta_{x1} + \sin\phi_1\beta_{y1}) + \left\{\omega_2\left[\sin\theta\left(z_1 - \frac{D}{2}\beta_{z1} - b\right) + \right.\right. \\ \left.\cos\theta\left[\cos\phi_1\left(x_1 - \frac{D}{2}\beta_{x1}\right) + \sin\phi_1\left(y_1 - \frac{D}{2}\beta_{y1}\right) + a\right]\right] - \\ \left.\omega_1\left[\cos\phi_1\left(x_1 - \frac{D}{2}\beta_{x1}\right) + \sin\phi_1\left(y_1 - \frac{D}{2}\beta_{y1}\right)\right]\right\} \\ (-\sin\phi_1\beta_{x1} + \cos\phi_1\beta_{y1}) + \omega_2\sin\theta \\ \left[-\sin\phi_1\left(x_1 - \frac{D}{2}\beta_{x1}\right) + \cos\phi_1\left(y_1 - \frac{D}{2}\beta_{y1}\right)\right]\beta_{z1} = 0 \\ x_1 = x_1(t) \\ y_1 = y_1(t) \\ z_1 = z_1(t) \\ x_2 = (-\cos\phi_1\cos\phi_2\cos\theta - \sin\phi_1\sin\phi_2)(x_1 - D\beta_{x1}) + \\ (-\sin\phi_1\cos\phi_2\cos\theta + \cos\phi_1\sin\phi_2)(y_1 - D\beta_{y1}) - \\ \cos\phi_2\sin\theta(z_1 - D\beta_{z1}) + \cos\phi_2(b\sin\theta - a\cos\theta) \\ y_2 = (\cos\phi_1\sin\phi_2 - \sin\phi_1\cos\phi_2)(x_1 - D\beta_{x1}) + \\ (\sin\phi_1\sin\phi_2\cos\theta + \cos\phi_1\cos\phi_2)(y_1 - D\beta_{y1}) + \\ \sin\phi_2\sin\theta(z_1 - D\beta_{z1}) - \sin\phi_2(b\sin\theta - a\cos\theta) \\ z_2 = \cos\phi_1\sin\theta(x_1 - D\beta_{x1}) + \sin\phi_1\sin\theta(y_1 - D\beta_{y1}) - \\ \cos\theta(z_1 - D\beta_{z1}) + a\sin\theta + b\cos\theta \\ \omega_2 = i_{21}\omega_1 \\ \phi_2 = i_{21}\phi_1 \end{cases}$$

Wherein formulas:

$$\left[-\sin\phi_1\left(x_1 - \frac{D}{2}\beta_{x1}\right) + \cos\phi_1\left(y_1 - \frac{D}{2}\beta_{y1}\right)\right](\omega_1 - \omega_2\cos\theta)(\cos\phi_1\beta_{x1} + \sin\phi\beta_{y1}) +$$

$$\left\{\omega_2\left[\sin\theta\left(z_1 - \frac{D}{2} - b\right) + \cos\theta\left[\cos\phi_1\left(x_1 - \frac{D}{2}\beta_{x1}\right) + \sin\phi_1\left(y_1 - \frac{D}{2}\beta_{y1}\right) + a\right]\right] - \omega_1\left[\cos\phi_1\left(x_1 - \frac{D}{2}\beta_{x1}\right) + \sin\phi_1\left(y_1 - \frac{D}{2}\beta_{y1}\right)\right]\right\}$$

$$(-\sin\phi_1\beta_{x1} + \cos\phi_1\beta_{y1}) - \omega_2\sin\theta\left[-\sin\phi_1\left(x_1 - \frac{D}{2}\beta_{x1}\right) + \cos\phi_1\left(y_1 - \frac{D}{2}\beta_{y1}\right)\right]\beta_{z1} = 0$$

are the mesh equations of the space conjugate curve;
$r_1 = x_1(t)i_1 + y_1(t)j_1 + z_1(t)k_1$ is the radius vector expression of the central lines of the driving tines;

$$\begin{cases} x_1 = x_1(t) \\ y_1 = y_1(t) \\ z_1 = z_1(t) \end{cases}$$

are the expression of the space curve equations of the central lines of the driving tines; t is a parameter, and $-\pi < t$, end point value of t is determined by the mesh equation of the space conjugate curve;

$\beta_1$ is the unit principal normal vector of the mesh point, namely $\beta_1 = \beta_{x1}i_1 + \beta_{y1}j_1 + \beta_{z1}k_1$, $i_1$, $j_1$, $k_1$ are respectively the unit vectors of each coordinate axis, $\beta_{x1}$, $\beta_{y1}$, $\beta_{z1}$ are the magnitudes of the unit principal normal vector $\beta_1$ at each of the $x_1$, $y_1$, $z_1$ coordinate axis component, wherein:

$$\beta_{x1} = \frac{x_1''(t)[x_1'^2(t) + y_1'^2(t) + z_1'^2(t)] - x_1'(t)\dfrac{[x_1'(t)x_1''(t) + y_1'(t)y_1''(t) + z_1'(t)z_1''(t)]}{1}}{\nabla[x_1'^2(t) + y_1'^2(t) + z_1'^2(t)]^2}$$

$$\beta_{y1} = \frac{y_1''(t)[x_1'^2(t) + y_1'^2(t) + z_1'^2(t)] - y_1'(t)\dfrac{[x_1'(t)x_1''(t) + y_1'(t)y_1''(t) + z_1'(t)z_1''(t)]}{1}}{\nabla[x_1'^2(t) + y_1'^2(t) + z_1'^2(t)]^2}$$

$$\beta_{z1} = \frac{z_1''(t)[x_1'^2(t) + y_1'^2(t) + z_1'^2(t)] - z_1'(t)\dfrac{[x_1'(t)x_1''(t) + y_1'(t)y_1''(t) + z_1'(t)z_1''(t)]}{1}}{\nabla[x_1'^2(t) + y_1'^2(t) + z_1'^2(t)]^2}$$

$$\nabla = |\ddot{r}_1| = \left|\frac{d^2 r_1}{ds^2}\right|,$$

$r_1$ is the radius vector of the central lines of the driving tines, s is the arc length of the curve of the central line; the space curve equations of the central lines of the driven tines conjugate with the central lines of the driving tines are:

$$\begin{cases} x_2 = (-\cos\phi_1\cos\phi_2\cos\theta - \sin\phi_1\sin\phi_2)(x_1 - D\beta_{x1}) + \\ (-\sin\phi_1\cos\phi_2\cos\theta + \cos\phi_1\sin\phi_2)(y_1 - D\beta_{y1}) - \\ \cos\phi_2\sin\theta(z_1 - D\beta_{z1}) + \cos\phi_2(b\sin\theta - a\cos\theta) \\ y_2 = (\cos\phi_1\sin\phi_2 - \sin\phi_1\cos\phi_2)(x_1 - D\beta_{x1}) + \\ (\sin\phi_1\sin\phi_2\cos\theta + \cos\phi_1\cos\phi_2)(y_1 - D\beta_{y1}) + \\ \sin\phi_2\sin\theta(z_1 - D\beta_{z1}) - \sin\phi_2(b\sin\theta - a\cos\theta) \\ z_2 = \cos\phi_1\sin\theta(x_1 - D\beta_{x1}) + \sin\phi_1\sin\theta(y_1 - D\beta_{y1}) - \\ \cos\theta(z_1 - D\beta_{z1}) + a\sin\theta + b\cos\theta \end{cases}$$

in the equations:
θ—the included angle between plane $x_p o_p y_p$ and plane x o y is also the supplementary angle of the included angle between the axes of the driving wheel and the driven wheel, the range is 0°~180°; a, b—the distance from point $O_p$ to axis z is a, a>0; the distance from point $O_p$ to axis x is b, b>0; $\omega_1$, $\omega_2$—angular velocities of the driving wheel and the driven wheel respectively; $i_{12}$—angular velocity ratio of the driving wheel and the driven wheel, namely the ratio of the number of the driven tines and the number of the driving tines; $i_{21}$—reciprocal of $i_{12}$, angular velocity ratio of the driven wheel and the driving wheel, namely the ratio of the number of the driving tines and the number of the driven tines; D—the diameter of the driving tines and the driven tines.

When the space curve equations of the central lines of the driving tines and values of a, b, D, $i_{12}$, θ are determined, the space curve equations of conjugate central lines of the driven cant hook are also determined so as to obtain a set of space curve mesh driving pair.

On basis of above-mentioned space curve mesh driving pair, the invention relates to a polyhedral space curve mesh transmission, wherein the driving pair in said transmission adopts above-mentioned space curve mesh driving pair. Said transmission comprises an upper box body, a lower box body, an input shaft and an output shaft installed on the upper box body and lower box body; the transmission is an N-stage polyhedral space curve mesh transmission, N is an integer greater than or equal to 1, and is equal to the transmission stage of the gearbox body; the first stage transmission of the transmission comprises a gear set, namely a driving wheel, an input shaft, multiple driven wheels and multiple output shafts; each transmission stage of the transmission comprises at least a gear set, each gear set only comprises an input shaft; the input shaft of each gear set is independently coaxially connected with the output shaft of the gear set in the last stage transmission to move at the same angular velocity; each input shaft is connected with a driving wheel, the axis of the driving wheel overlaps with the axis of the input shaft; each output shaft is connected with a driven wheel, the axis of the driven wheel overlaps with the axis of the output shaft; in the same gear set, the driving wheel on the input shaft meshes with the driven wheel on the output shaft via the driving tines and driven tines; an input shaft and axes of all output shafts are arranged in a polygonal pyramid shape, namely the axes of all output shafts are concurrent in the space; the included angles between the axes of two adjacent output shaft are the same, and are axially symmetrical distributed around the axes of the input shaft. Each gear set of the K−1 stage of transmission comprises multiple output shafts which are coaxially fixedly connected with the input shaft of each gear set in the K-stage transmission and rotate at the same angular velocity, K can be any integer greater than or equal to 2 and smaller than or equal to N; the input shaft of each gear set in the K-stage transmission is extended according to the axial direction and is also an output shaft of the K-stage transmission; the number of the input shafts in the K-stage transmission is equal to the number of the output shafts in the K−1 stage transmission, the number of the output shafts in the K-stage transmission is equal to the sum of the edges of said polygonal pyramid in the K-stage transmission plus the number of the input shafts in the K-stage transmission.

In above-mentioned space curve mesh driving pair, the upper box body and the lower box body form an airtight housing; the upper box body and the lower box body are provided with holes for installing said input shafts and output shafts.

The present invention is a drive method of micro-machines by carrying out fundamental theory innovation (based on the space curve mesh theory of any intersecting shafts) based on the drive mechanism form of conventional mechanisms (gear drive form) and can provide a continuous and stable mesh transmission for micro-machines. The invention tremendously simplifies the structures of the transmission gear and transmission of the micro-mechanism, reduces the geometrical dimension, decreases the mass, enhances the operation flexibility, has a low price and is convenient to be applied in the micro electronic and mechanical field. Generally speaking, compared with the existing drive mechanism, the invention has advantages as follows:

1. The space curve mesh driving pair can realize motion transmission of shafts which intersect with each other by 0°~180° in the same plane in the space (in the invention, the angle can be equal to 90°, also can be not equal to 90°; when the angle is equal to 90°, the two shafts are orthogonal.); as the two axes are in the same plane and can form an intersection angle of 0°~180°, the application scope thereof is wider than the motion pair which is used for motion transmission between parallel shafts or orthogonal shafts;

2. The space curve mesh driving pair only comprises a driving pair, so that the component number of the drive system is reduced to the minimum; compared with the conventional micro speed change mechanism (For example the micro planetary gear mechanism), the space curve mesh driving pair has a very simple structure; compared with other transmission technologies (For example SMA drive, thermal expansion drive, piezoelectric drive and electromagnetic drive), the invention can realize a continuous drive at a high rotation speed (For example 1000 r/m);

3. The space curve mesh driving pair has good manufacturability and economical efficiency, can be manufactured to a universal micro or micro drive mechanism or speed reducer, is convenient to simplify the structures of tiny or micro mechanical and electronic products, saves space, reduces the mass and has a low cost.

4. The space curve mesh driving pair can realize transmission with large transmission ratio (for example 12:1) similar to the worm and worm gear, meanwhile the space size thereof is much smaller than that of the worm gear driving pair, and is easy to be manufactured;

5. The space curve mesh driving pair can realize a continuous and stable mesh transmission, and has significant improvements and more widely application compared with the existing micro-drive technology of the non-conventional mechanisms.

6. The polyhedral space curve mesh transmission has a compact arrangement. Outputs of dozens of transmission ratios can be realized in a smaller space with the rational arrangement, particularly is suitable to be applied on micro-machines which require single input—multiple outputs.

7. The polyhedral space curve mesh transmission has a flexible design. Different required transmission ratio can be obtained by only changing the parameter equations of the driving and driven wheel without changing other structures.

8. The polyhedral space curve mesh transmission has good manufacturability and economical efficiency. The space curve mesh wheel has a light weight, is simple to he manufactured, has a low cost and can meet multiple deceleration demands.

DETAILED DESCRIPTION OF THE INVENTION

The specific implementation of the invention is further described as follows, but the implementations of the invention are not limited to this.

Figure 1:
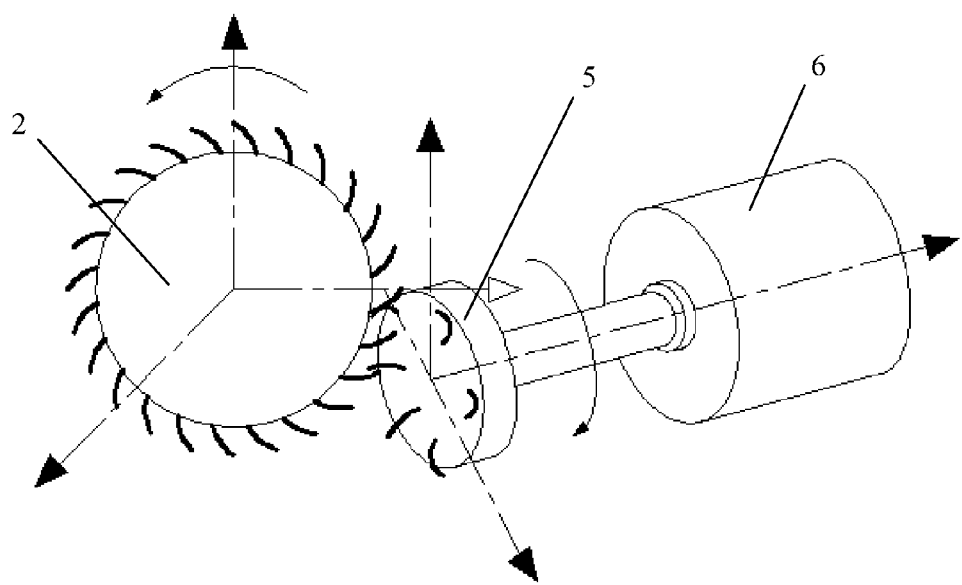
FIG. 1 is a schematic diagram of the space curve mesh driving pair in the implement way.
Figure 2:
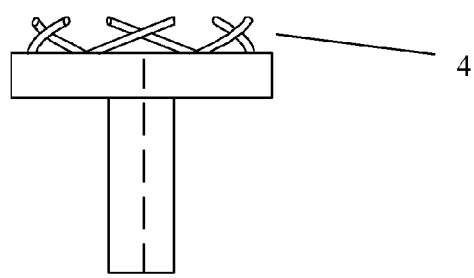
FIG. 2 is a front view of the driving wheel and driving tines of the space curve mesh driving pair shown in FIG. 1.
Figure 3:
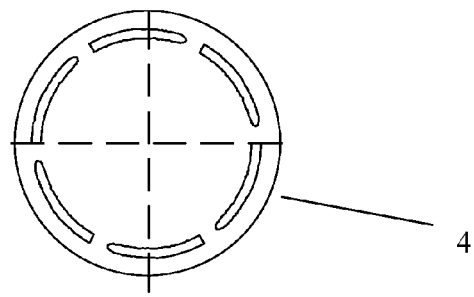
FIG. 3 is a top view of the driving wheel and driving tines of the space curve mesh driving pair shown in FIG. 1.
Figure 4:
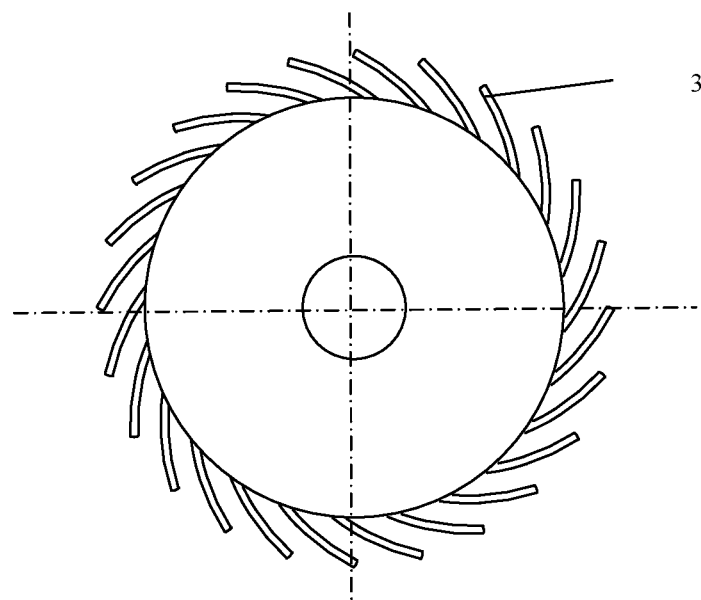
FIG. 4 is a schematic diagram of the driven wheel and driven tines of the space curve mesh driving pair shown in FIG. 1.

As shown in FIG. 1, the connection relations of the space curve mesh driving pair of the invention comprise: the driving wheel 5 is fixedly connected with the drive (motor 6), the driven wheel 2 is connected with the driven device. As shown in FIG. 2 and FIG. 3, the driving can hooks 4 are uniformly arranged on the circumference of the end face of the driving wheel; as shown in FIG. 4, the driven can hooks 3 are uniformly arranged on the circumference of the end face of the driven wheel, the driving wheel and the driven wheel form a driving pair. The driving tines mesh with the driven tines to realize the drive between any intersecting shafts in the space. The driving tines and the driven tines are designed and manufactured based on the space curve mesh theory of any intersecting shafts. Specifically, the shape of the driving tines is a space helical line and the shape of the driven tines is a conjugate space curve.

The drive principle thereof is: the driving wheel is driven by a micro-motor and rotates, a pair of driving cant hook and driven cant hook contact with each other and begin mesh to realize drive between any intersecting shafts in the space. After the pair of tines mesh for a period of time, the mesh is about to separate but the mesh is not separated completely, the next pair of tines continue participating in the meshing, hence a continuous and stable mesh transmission is realized. The determination of the shapes of the space curve of the driving tines and driven tines is further described as follows with combination of attached figures.

Figure 5:
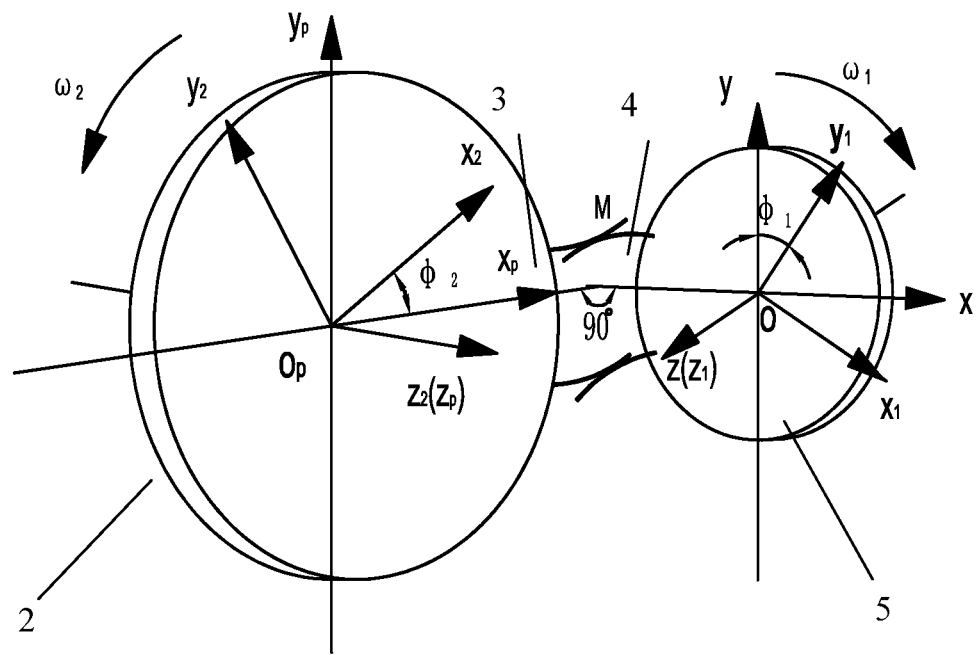
FIG. 5 is a schematic diagram when the included angle of the axes of the driving wheel and the driven wheel is 180°-θ in the implement way.
Figure 6:
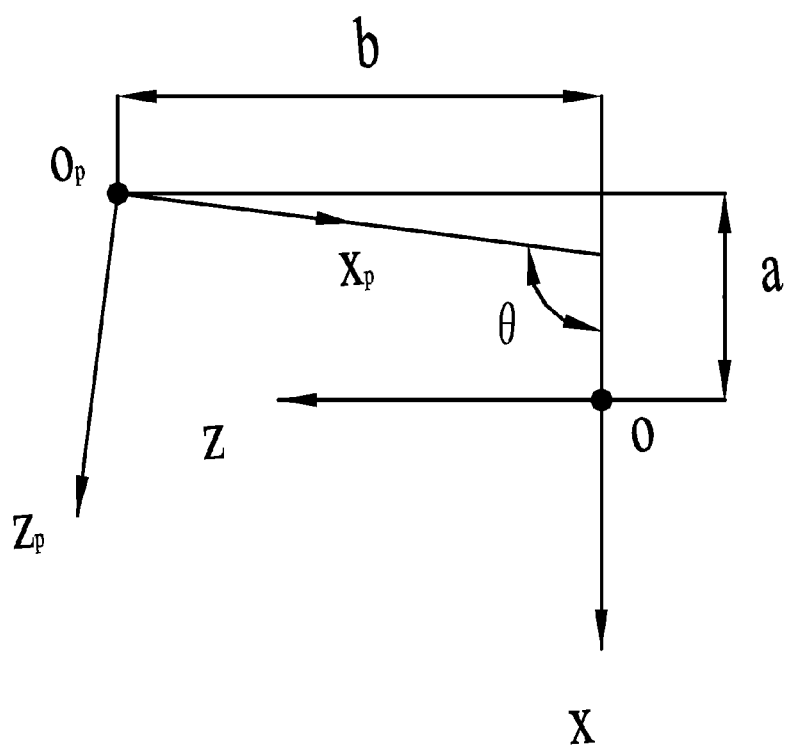
FIG. 6 is a top view of part of the coordinate schematic diagram shown in FIG. 5.

As shown in FIG. 5 and FIG. 6, in two space Cartesian coordinate systems of o-x,y,z and $o_p$-$x_p$,$y_p$,$z_p$, O is the origin of the coordinate system o-x,y,z, $O_p$ is the origin of the coordinate system $o_p$-$x_p$,$y_p$,$z_p$; axis Z overlaps with the axes of the driving wheel, axis $Z_p$ overlaps with the axes of the driven wheel, plane xoz and plane $x_p o_p z_p$ are in the same plane; the included angle between plane $x_p o_p y_p$ and plane x o y is θ, and 0°≤θ≤180°; the distance from point $O_p$ to axis z is a, the distance to axis x is b; space Cartesian coordinate system $o_1$-$x_1$,$y_1$,$z_1$ is fixedly connected with the driving wheel, space Cartesian coordinate system $o_2$-$x_2$,$y_2$,$z_2$ is fixedly connected with the driven wheel, they overlap with the coordinate system o-x,y,z and $o_p$-$x_p$,$y_p$,$z_p$ at the original position; the driving wheel rotates at a uniform angular velocity $\omega_1$ around axis z, the driven wheel rotates at a uniform angular velocity $\chi_2$ around axis $Z_p$; after a period of time from the original position, the coordinate systems $o_1$-$x_1$,$y_1$,$z_1$ and $o_2$-$x_2$,$y_2$,$z_2$ rotate respectively, at this moment the driving wheel turns angle $\phi_1$ around axis Z, the driven wheel turns angle $\phi_2$ around axis $Z_p$;

the space curve equations of the central lines of the driving tines and the driven tines can be expressed as:

$$\begin{cases} \left[-\sin\phi_1\left(x_1 - \frac{D}{2}\beta_{x1}\right) + \cos\phi_1\left(y_1 - \frac{D}{2}\beta_{y1}\right)\right](\omega_1 - \omega_2\cos\theta) \\ (\cos\phi_1\beta_{x1} + \sin\phi_1\beta_{y1}) + \left\{\omega_2\left[\sin\theta\left(z_1 - \frac{D}{2}\beta_{z1} - b\right) + \right.\right. \\ \left.\left. \cos\theta\left[\cos\phi_1\left(x_1 - \frac{D}{2}\beta_{x1}\right) + \sin\phi_1\left(y_1 - \frac{D}{2}\beta_{y1}\right) + a\right]\right] - \right. \\ \left. \omega_1\left[\cos\phi_1\left(x_1 - \frac{D}{2}\beta_{x1}\right) + \sin\phi_1\left(y_1 - \frac{D}{2}\beta_{y1}\right)\right]\right\} \\ (-\sin\phi_1\beta_{x1} + \cos\phi_1\beta_{y1}) + \omega_2\sin\theta \\ \left[-\sin\phi_1\left(x_1 - \frac{D}{2}\beta_{x1}\right) + \cos\phi_1\left(y_1 - \frac{D}{2}\beta_{y1}\right)\right]\beta_{z1} = 0 \\ x_1 = x_1(t) \\ y_1 = y_1(t) \\ z_1 = z_1(t) \\ x_2 = (-\cos\phi_1\cos\phi_2\cos\theta - \sin\phi_1\sin\phi_2)(x_1 - D\beta_{x1}) + \\ (-\sin\phi_1\cos\phi_2\cos\theta + \cos\phi_1\sin\phi_2)(y_1 - D\beta_{y1}) - \\ \cos\phi_2\sin\theta(z_1 - D\beta_{z1}) + \cos\phi_2(b\sin\theta - a\cos\theta) \\ y_2 = (\cos\phi_1\sin\phi_2 - \sin\phi_1\cos\phi_2)(x_1 - D\beta_{x1}) + \\ (\sin\phi_1\sin\phi_2\cos\theta + \cos\phi_1\cos\phi_2)(y_1 - D\beta_{y1}) + \\ \sin\phi_2\sin\theta(z_1 - D\beta_{z1}) - \sin\phi_2(b\sin\theta - a\cos\theta) \\ z_2 = \cos\phi_1\sin\theta(x_1 - D\beta_{x1}) + \sin\phi_1\sin\theta(y_1 - D\beta_{y1}) - \\ \cos\theta(z_1 - D\beta_{z1}) + a\sin\theta + b\cos\theta \\ \omega_2 = i_{21}\omega_1 \\ \phi_2 = i_{21}\phi_1 \end{cases}$$

Wherein formulas:

$$\left[-\sin\phi_1\left(x_1 - \frac{D}{2}\beta_{x1}\right) + \right. \\ \left. \cos\phi_1\left(y_1 - \frac{D}{2}\beta_{y1}\right)(\omega_1 - \omega_2\cos\theta)(\cos\phi_1\beta_{x1} + \sin\phi\beta_{y1}) + \right. \\ \left\{\omega_2\left[\sin\theta\left(z_1 - \frac{D}{2} - b\right) + \cos\theta\left[\cos\phi_1\left(x_1 - \frac{D}{2}\beta_{x1}\right) + \sin\phi_1\left(y_1 - \frac{D}{2}\beta_{y1}\right) + \right.\right.\right. \\ \left.\left.\left. a\right]\right] - \omega_1\left[\cos\phi_1\left(x_1 - \frac{D}{2}\beta_{x1}\right) + \sin\phi_1\left(y_1 - \frac{D}{2}\beta_{y1}\right)\right]\right\} \\ (-\sin\phi_1\beta_{x1} + \cos\phi_1\beta_{y1}) - \omega_2\sin\theta\left[-\sin\phi_1\left(x_1 - \frac{D}{2}\beta_{x1}\right) + \right. \\ \left. \cos\phi_1\left(y_1 - \frac{D}{2}\beta_{y1}\right)\right]\beta_{z1} = 0$$

are the mesh equations of the space conjugate curve;

$r_1 = x_1(t)i_1 + y_1(t)j_1 + z_1(t)k_1$ is the radius vector expression of the central lines of the driving tines;

$$\begin{cases} x_1 = x_1(t) \\ y_1 = y_1(t) \\ z_1 = z_1(t) \end{cases}$$

are the expressions of the space curve equations of the central lines of the driving tines; t is a parameter, and $-\pi < t$, end point value of t is determined by the mesh equations of the space conjugate curve;

$\beta_1$ is the unit principal normal vector of the mesh point, namely $\beta_1=\beta_{x1}i_1+\beta_{y1}j_1+\beta_{z1}k_1$, $i_1$, $j_1$, $k_1$ are respectively the unit vectors of each coordinate axis, $\beta_{x1}$, $\beta_{y1}$, $\beta_{z1}$ are the magnitude of the unit principal normal vector $\beta_1$ at each of the $x_1$, $y_1$, $z_1$ coordinate axis component, wherein:

$$\beta_{x1} = \frac{x_1''(t)[x_1'^2(t)+y_1'^2(t)+z_1'^2(t)]-x_1'(t)\begin{bmatrix}x_1'(t)x_1''(t)+y_1'(t)y_1''(t)+\\z_1'(t)z_1''(t)\end{bmatrix}}{\nabla[x_1'^2(t)+y_1'^2(t)+z_1'^2(t)]^2}$$

$$\beta_{y1} = \frac{y_1''(t)[x_1'^2(t)+y_1'^2(t)+z_1'^2(t)]-y_1'(t)\begin{bmatrix}x_1'(t)x_1''(t)+y_1'(t)y_1''(t)+\\z_1'(t)z_1''(t)\end{bmatrix}}{\nabla[x_1'^2(t)+y_1'^2(t)+z_1'^2(t)]^2}$$

$$\beta_{z1} = \frac{z_1''(t)[x_1'^2(t)+y_1'^2(t)+z_1'^2(t)]-z_1'(t)\begin{bmatrix}x_1'(t)x_1''(t)+y_1'(t)y_1''(t)+\\z_1'(t)z_1''(t)\end{bmatrix}}{\nabla[x_1'^2(t)+y_1'^2(t)+z_1'^2(t)]^2}$$

$$\nabla = |\ddot{r}_1| = \left|\frac{d^2 r_1}{ds^2}\right|,$$

$r_1$ is the radius vector of the central lines of the driving tines, s is the arc length of the curve of the central line; the space curve equations of the central lines of the driven tines conjugate with the central lines of the driving tines are:

$$\begin{cases} x_2 = (-\cos\phi_1\cos\phi_2\cos\theta-\sin\phi_1\sin\phi_2)(x_1-D\beta_{x1})+\\ (-\sin\phi_1\cos\phi_2\cos\theta+\cos\phi_1\sin\phi_2)(y_1-D\beta_{y1})-\\ \cos\phi_2\sin\theta(z_1-D\beta_{z1})+\cos\phi_2(b\sin\theta-a\cos\theta)\\ y_2 = (\cos\phi_1\sin\phi_2-\sin\phi_1\cos\phi_2)(x_1-D\beta_{x1})+\\ (\sin\phi_1\sin\phi_2\cos\theta+\cos\phi_1\cos\phi_2)(y_1-D\beta_{y1})+\\ \sin\phi_2\sin\theta(z_1-D\beta_{z1})-\sin\phi_2(b\sin\theta-a\cos\theta)\\ z_2 = \cos\phi_1\sin\theta(x_1-D\beta_{x1})+\sin\phi_1\sin\theta(y_1-D\beta_{y1})-\\ \cos\theta(z_1-D\beta_{z1})+a\sin\theta+b\cos\theta \end{cases}$$

in the equation:

$\theta$—the included angle between plane $x_p o_p y_p$ and plane x o y is also the supplementary angle of the included angle between the axis of the driving wheel and the axis the driven wheel, the range is 0°~180°; a, b—the distance from point $O_p$ to axis z is a, a>0; the distance from point $O_p$ to axis x is b, b>0; $\omega_1$, $\omega_2$—angular velocities of the driving wheel and the driven wheel respectively; $i_{12}$—angular velocity ratio of the driving wheel and the driven wheel, namely the ratio of the number of the driven tines and the number of the driving tines; $i_{21}$—reciprocal of $i_{12}$, angular velocity ratio of the driven wheel and the driving wheel, namely the ratio of the number of the driving tines and the number of the driven tines; D—the diameter of the driving tines and the driven tines;

When the space curve equations of the central lines of the driving tines and values of a, b, D, $i_{12}$, $\theta$ are determined, the space curve equations of conjugate central lines of the driven cant hook are also determined so as to obtain a set of space curve mesh driving pair.

When in above formula: the equations of the central lines of the driving hooks are $$\begin{cases} x_1 = 5\cos t\\ y_1 = 5\sin t\\ z_1 = 3t+3\pi \end{cases} \left(\text{at this time} -\pi < t < -\frac{\pi}{2}\text{ after calculation}\right),$$

$\theta=120°$, a=20 mm, b=20 mm, $i_{12}=4$, the number of the driving tines is 6, the number of the driven tines is 24, when D=1.2 mm, the space curve equations of the central lines of the driven tines are:

$$\begin{cases} x_2 = \cos\frac{\pi+t}{4}\left[6.9+(20-3t-3\pi)\frac{\sqrt{3}}{2}\right]\\ y_2 = -\sin\frac{\pi+t}{4}\left[6.9+(20-3t-3\pi)\frac{\sqrt{3}}{2}\right]\\ z_2 = 6.9\sqrt{3}-\frac{1}{2}(20-3t-3\pi). \end{cases}$$

The shape of the driven wheel can be obtained according to the equations of the central lines of the driven tines, the shape thereof is as shown in FIG. 4.

EXAMPLES

Figure 7:
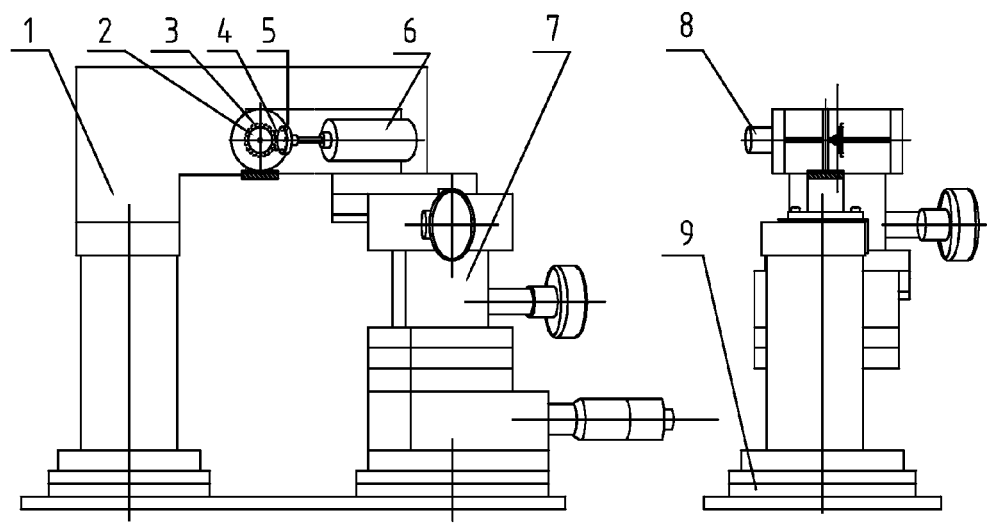
FIG. 7 is a schematic diagram of the application of the space curve mesh driving pair in the implement way.

In the example, installing the space curve mesh driving pair on an experiment table is taken as the example. As shown in FIG. 7, the experiment table comprises a bracket 1, a driving wheel 5, driving tines 4, driven tines 3, a driven wheel 2, a micro-motor 6, a precision three-dimensional moving table 7, an encoder 8 and an index plate 9.

The precision three-dimensional moving table 7 is installed on the index plate 9, the micro-motor 6 is fixed on the precision three-dimensional moving table 7, the driving wheel 5 is fixedly connected with the spindle of the micro-motor 6, the encoder 8 is fixed on the bracket 1, the driven wheel 2 is fixedly connected with the encoder 8. Intersection angle of 0°~180° can be obtained by indexing of the index plate. The driving wheel 5 and the driven wheel 2 form a driving pair via the mesh action between the driving tines 4 and the driven tines 3. The commercially available micro-motor 6 adopts a DC motor with outer diameter of 8 mm and takes an ordinary 2V battery as the power source.

In the example: the equations of the central lines of the driving tines are $$\begin{cases} x_1 = 5\cos t\\ y_1 = 5\sin t\\ z_1 = 3t+3\pi \end{cases} \left(\text{at this time} -\pi < t < -\frac{\pi}{2}\right),$$

$\theta=120°$, transmission ratio $i_{12}=4$, a=20 mm, b=20 mm, the number of the driving tines is 6, the number of the driven tines is 24, the diameters D of the driving tines and the driven tines are all 1.2 mm.

The equations of the central lines of the driven tines are:

$$\begin{cases} x_2 = \cos\frac{\pi+t}{4}\left[6.9+(20-3t-3\pi)\frac{\sqrt{3}}{2}\right]\\ y_2 = -\sin\frac{\pi+t}{4}\left[6.9+(20-3t-3\pi)\frac{\sqrt{3}}{2}\right]\\ z_2 = 6.9\sqrt{3}-\frac{1}{2}(20-3t-3\pi). \end{cases}$$

Then the shape of the driving pair of the driving and driven wheels can be determined according to the equation of the central line.

As shown in FIG. 2 and FIG. 3, the driving wheel and the driving tines are made from photosensitive resins by the rapid prototyping technology and are an integrated structure. The central lines of the driving tines are space helical lines and the diameter D thereof is 1.2 mm.

As shown in FIG. 4, the driven wheel and the driven tines are made from photosensitive resins by the rapid prototyping technology and are an integrated structure. The central lines of the driven tines are space curves conjugate with the central lines of the driving tines (space helical lines) and the diameter D thereof is 1.2 mm.

The space curve mesh driving pair developed in the example is carried out with a kinematic experiment, the experiment result is that the rotation speed of the driven wheel detected via the encoder is stable when the rotation speed of the driving wheel is constant (1000 r/m); the instantaneous transmission ratio and the average transmission ratio are stable. The result demonstrates that angular gears can realize continuous and stable mesh drive. It shows that the space curve mesh driving pair developed in the invention is practicable.

A polyhedral space curve mesh transmission is provided by applying the principle of above-mentioned space curve mesh driving pair. Referring to the conventional transmission, for any specified rotation speed, the speed change process from the input before the speed is changed to the output after the speed is changed, the number of the space curve mesh driving pairs participating the speed change process is defined as the transmission stage. The polyhedral space curve mesh transmission can be divided into single-stage polyhedral space curve mesh transmission and multiple-stage polyhedral space curve mesh transmission. N-stage polyhedral space curve mesh transmission is used hereinafter uniformly, wherein N is an integer greater than or equal to 1 and is equal to the transmission stage of the transmission. When N=1, it demonstrates that the transmission is a single stage polyhedral space curve mesh transmission; when N>2, it demonstrates that the transmission is a multiple-stage polyhedral space curve mesh transmission.

The first stage transmission of the N-stage polyhedral space curve mesh transmission comprises a gear set, namely a driving wheel, an input shaft, multiple driven wheels and multiple output shafts (the number of the driven wheels and output shafts is related to the number of the edges of hereinafter described polygonal pyramid arrangement, and can be determined according to actual demands; see the example below for details.). The input shaft is connected with the driving wheel, the axis of the driving wheel overlaps with the axis of the input shaft; each output shaft is connected with a driven wheel, the axis of the driven wheel overlaps with the axis of the output shaft. The driving wheel on the input shaft meshes with the driven wheels on all of the output shafts via the driving tines and driven tines; axes of the input shaft and all of the output shafts are arranged in accordance with a regular polygonal pyramid, namely the central lines of all of the output shafts are concurrent in the space, the angles between the axes of two adjacent output shafts are the same and are axisymmetrically distributed around the axis of the input shaft.

Each stage transmission of the N-stage polyhedral space curve mesh transmission comprises at least a gear set. Each gear set only comprises an input shaft which is independently fixedly connected with the output shaft of the gear set in the last stage transmission. In the same gear set, the driving wheel on the input shaft meshes with the driven wheel on the output shaft, the axes of one input shaft and all of the output shafts are arranged according to a regular polygonal pyramid, namely the axes of all of the output shafts are concurrent in the space; the angles between the axes of two adjacent output shafts are the same and are axisymmetrically distributed around the axis of the input shaft.

Provided that K is any integer greater than or equal to 2 and less than or equal to N. The K−1 stage transmission comprises multiple output shafts which are coaxially fixedly connected with the input shaft of the K-stage transmission respectively to rotate at the same angular velocity. The input shaft of each gear set in the K-stage transmission is extended according to the axial direction and is also an output shaft of the K-stage transmission; the number of the input shafts in the K-stage transmission is equal to the number of the output shafts in the K−1-stage transmission; the number of the output shafts in the K-stage transmission is equal to the sum of the edges of said polygonal pyramid in the K-stage transmission plus the number of the input shafts in the K-stage transmission.

When N=1, the upper box body and the lower box body of the N-stage polyhedral space curve mesh transmission form an airtight shell to play a role of supporting and fixing to all of the input shafts and output shafts. The upper box body and the lower box body can be provided with holes in accordance with the positions and outer diameters of the input shafts and output shafts.

When N≥2, the upper box body of the N-stage polyhedral space curve mesh transmission are divided into inner and outer N layers correspondingly. The innermost layer is similar to the four-surface space shell of the upper box body of the single-stage polyhedral space curve mesh transmission. The other layers are all multiple-surface space housings; the upper box body and the lower box body can be provided with holes in accordance with the positions and outer diameters of the input shafts and output shafts. The upper box body and the lower box body form an airtight shell space.

Taking a regular triangular pyramid arrangement for example, the design methods of single-stage polyhedral space curve mesh transmission and double-stage polyhedral space curve mesh transmission are described specifically as follows.

As shown in FIG. 5, firstly a space curve mesh coordinate system is established. In two space Cartesian coordinate systems of o-x,y,z and $o_p$-$x_p$,$y_p$,$z_p$, o is the origin of the coordinate system o-x,y,z, $O_p$ is the origin of the coordinate system $o_p$-$x_p$,$y_p$,$z_p$; axis Z overlaps with the axis of the driving wheel, axis $Z_p$ overlaps with the axis of the driven wheel, plane xoz and plane $x_p o_p z_p$ are in the same plane; the included angle between plane $x_p o_p y_p$ and plane x o y is θ, and 0°≤θ≤180°; the distance from point $O_p$ to axis z is a, the distance to axis x is b; space Cartesian coordinate system $o_1$-$x_1$,$y_1$,$z_1$ is fixedly connected with the driving wheel, space Cartesian coordinate system $o_2$-$x_2$,$y_2$,$z_2$ is fixedly connected with the driven wheel, they overlap with the coordinate system o-x,y,z and $o_p$-$x_p$,$y_p$,$z_p$ at the original position; the driving wheel rotates at a uniform angular velocity $\omega_1$ around axis z, the driven wheel rotates at a uniform angular velocity $\omega_2$ around axis $Z_p$; after a period of time from the original position, the coordinate systems $o_1$-$x_1$,$y_1$,$z_1$ and $o_2$-$x_2$,$y_2$,$z_2$ rotate respectively, at this moment the driving wheel turns angle $\phi_1$ around axis Z, the driven wheel turns angle $\phi_2$ around axis $Z_p$.

The central lines of the driving tines are helical lines, the equations thereof in o-xyz coordinate system meet:

$$\begin{cases} x_1 = m\cos t \\ y_1 = m\sin t \\ z_1 = nt + n\pi \end{cases} \quad \left(-\pi \leq t \leq -\frac{\pi}{2}\right)$$

Wherein, m is the helical radius; n is the helical pitch coefficient; t is the parameter and represents the value range of the coordinate value; after calculating in accordance with the mesh equation of above-mentioned space conjugate curve, $$-\pi \leq t \leq -\frac{\pi}{2},$$

which represents ¼ of the circumference.

Taking the driving wheel of the input shaft for example, assuming m=5, n=3, the space curve equation of the central line of one of the driving tines is:

$$\begin{cases} x_1 = 4\cos t \\ y_1 = 4\sin t \\ z_1 = 3t + 3\pi \end{cases} \left(-\pi \leq t \leq -\frac{\pi}{2}\right)$$

Figure 8:
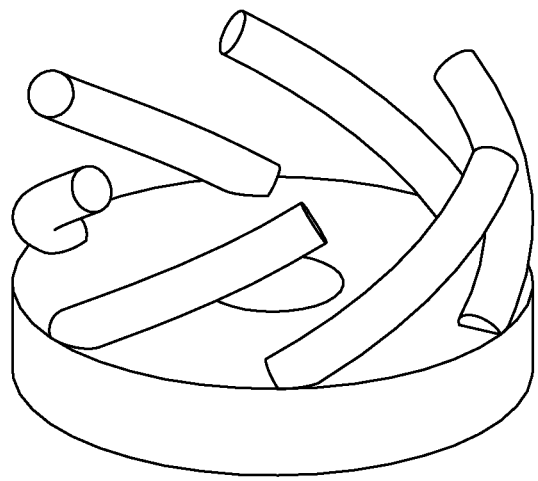
FIG. 8 is a schematic diagram of the driving wheel in the application example of the polyhedral space curve mesh transmission.

Assuming the number of the driving tines is 6, the diameters D of the tines are 1 mm. Taking the axis of the driving wheel body as the symmetry axis, 6 driving tines of the same shape are uniformly distributed on the outer edge of the driving wheel body to form the driving wheel, as shown in FIG. 8.

In accordance with the mesh equation of above-mentioned space conjugate curve, the curve equations of the central lines of the driving tines are:

$$\begin{cases} x_2 = \cos\frac{\pi+t}{i_{12}}[(m+D)\cos\theta - (nt+n\pi)\sin\theta + (b\sin\theta - a\cos\theta)] \\ y_2 = -\sin\frac{\pi+t}{i_{12}}[(m+D)\cos\theta - (nt+n\pi)\sin\theta + (b\sin\theta - a\cos\theta)] \\ z_2 = -(m+D)\sin\theta - (nt+n\pi)\cos\theta + a\sin\theta - b\cos\theta \end{cases}$$

$$\left(-\pi \leq t \leq -\frac{\pi}{2}\right)$$

Wherein, $i_{12}$ is the angular velocity ratio of the driving wheel and the driven wheel; D is the diameter of the driving tines and the driven tines. For example, assuming $i_{12}$=2, D=1 mm, θ=145°, a=b=12 mm, the space curve equation of the central line of one of the driven tines is:

$$\begin{cases} x_2 = \cos\frac{\pi+t}{2}\frac{[6\cos145° - (3t+3\pi)\sin145° +}{(12\sin145° - 12\cos145°)]} \left(-\pi \leq t \leq -\frac{\pi}{2}\right) \\ y_2 = -\sin\frac{\pi+t}{2}[6\cos145° - (3t+3\pi)\sin145° + (12\sin145° - 12\cos145°)] \\ z_2 = -6\sin145° - (3t+3\pi)\cos145° + (12\sin145° + 12\cos145°) \end{cases}$$

Figure 9:
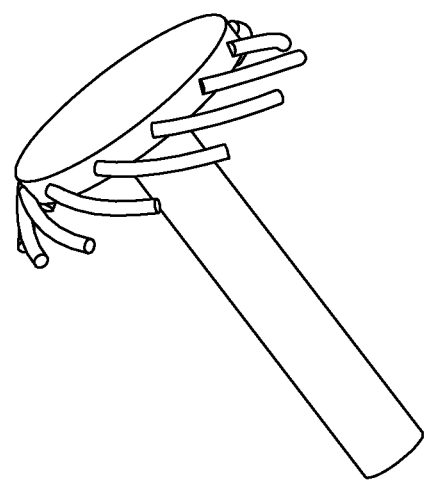
FIG. 9 is a schematic diagram of the driven wheel in the application example of the polyhedral space curve mesh transmission.

As $i_{12}$=2, the number of the driven tines is 12. In the same way, assuming the diameter of the tines D=1 mm, the driven tines are uniformly distributed on the outer edge of the driven wheel body to form the driven wheel, as shown in FIG. 9, In the same way, the central line equations of other driving cant hook and driven tines can be obtained by selecting different parameters. Wherein, the transmission ratio between each driven wheel and the same driving wheel can be the same or different.

Figure 10:
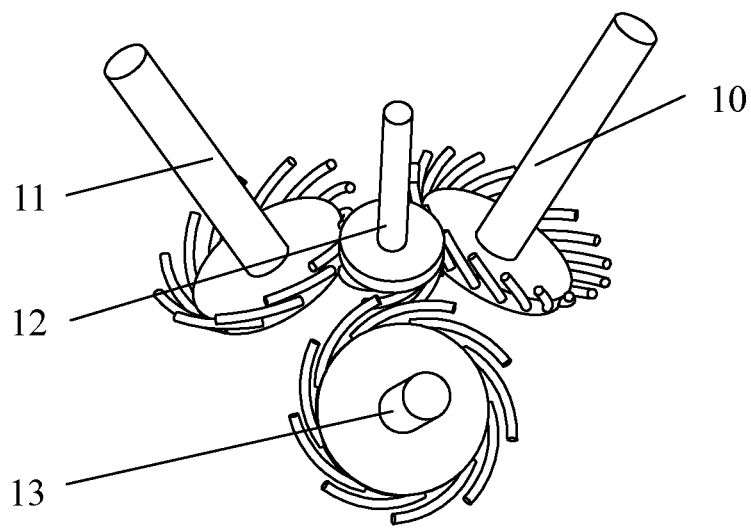
FIG. 10 is a schematic diagram of the drive system of the first stage polyhedral space curve mesh transmission.

Shown in FIG. 10 is a drive system of the single stage polyhedral space curve mesh transmission. In accordance with the requirements of the number of the transmission ratio, the single stage polyhedral space curve mesh transmission shown in the figure comprises a gear set, namely a driving wheel, an input shaft, three driven wheels and three output shafts. The input shaft is connected with a driving wheel, the axis of the driving wheel overlaps with the axis of the input shaft; each output shaft is connected with a driven wheel, the axis of the driven wheel overlaps with the axis of the output shaft. The driving wheel on the input shaft meshes with the driven wheels on the three output shafts via the driving tines and driven tines. The axis of the input shaft and the axes of the three output shafts are arranged in a regular triangular pyramid structure; the axes of the three output shafts are concurrent in the space, the angles between two adjacent output shafts are the same (60°) and are axisymmetrically distributed around the central line of the input shaft.

Figure 11:
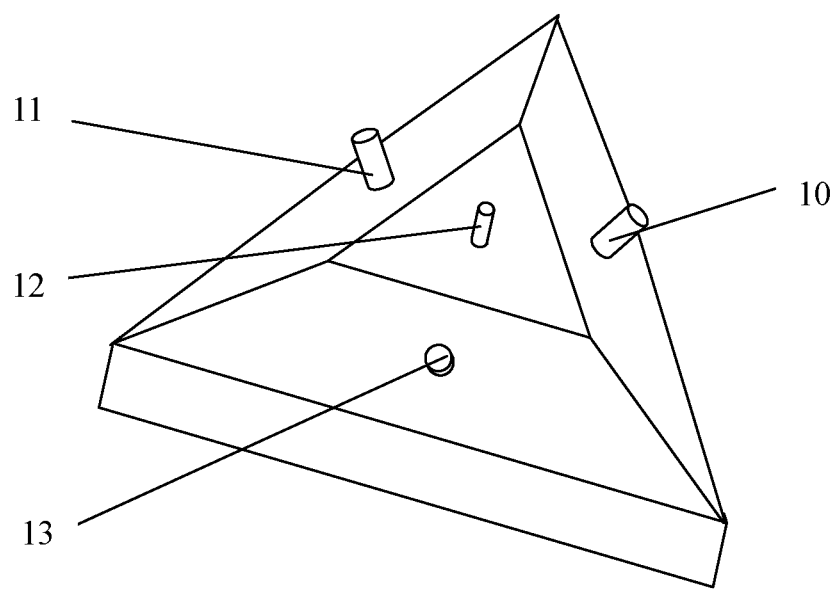
FIG. 11 is a schematic diagram of the appearance of the first stage polyhedral space curve mesh transmission shown in FIG. 10.

Shown in FIG. 11 is the appearance of the single stage polyhedral space curve mesh transmission shown in FIG. 10. The upper box body is a space multiple-surface shell, comprising one triangular top surface and three trapezoid side surfaces which are the same. The triangular top surface is perpendicular to the input shaft, the three trapezoid surfaces which are the same are respectively perpendicular to one of the output shafts; each surface is provided with holes in accordance with the sizes and positions of the drive shafts (input shafts and output shafts). The lower box body is a space multiple-surface shell comprising a triangular bottom surface and three of the same rectangular side surfaces in the vertical direction.

Figure 12:
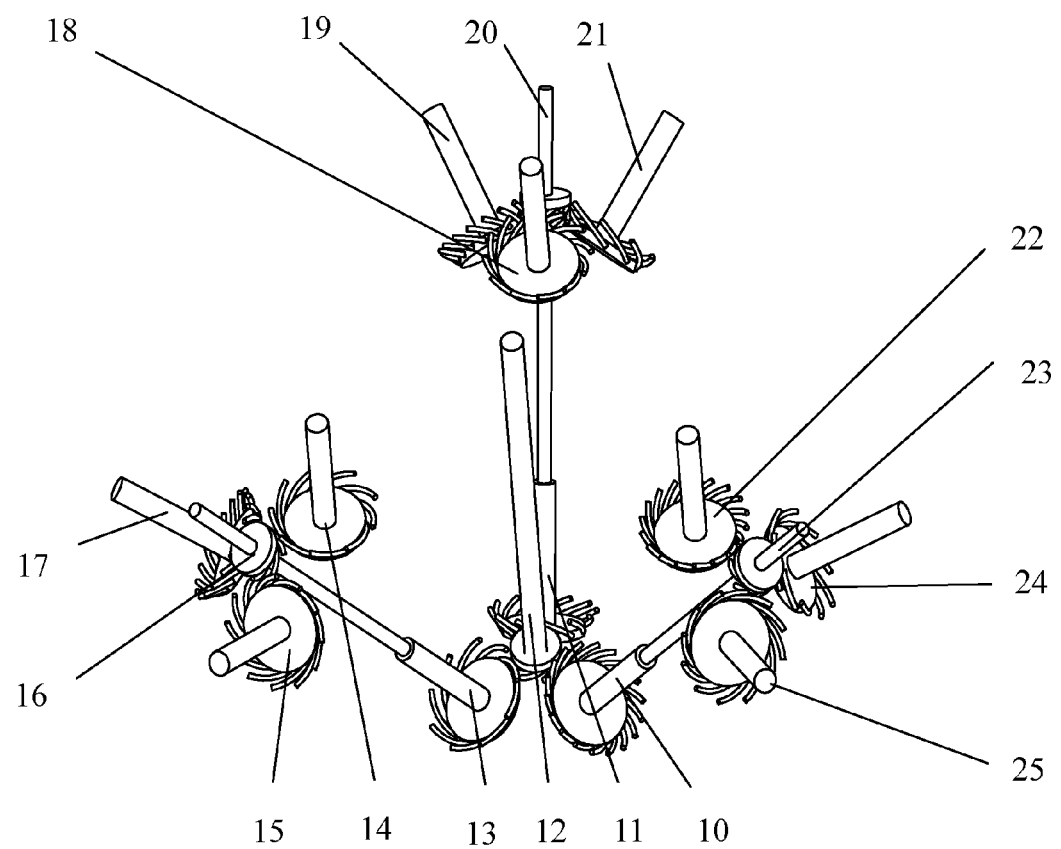
FIG. 12 is a schematic diagram of the drive system of the second stage polyhedral space curve mesh transmission.

Shown in FIG. 12 is a drive system of double-stage polyhedral space curve mesh transmission. The first-stage transmission of the double-stage polyhedral space curve mesh transmission comprises a gear set similar to the single-stage polyhedral space curve mesh transmission; the second-stage transmission comprises three gear sets similar to the single-stage polyhedral space curve mesh transmission. Specifically speaking, in the driving pair of the first-stage polyhedral space curve mesh transmission, three output shafts (10, 11, 13) of the first-stage transmission are respectively coaxially and fixedly connected with three input shafts (23, 20, 17) of the second-stage transmission to rotate at the same angular velocity. In above-mentioned three input shafts of the second-stage transmission, each input shaft drives a gear set (In FIG. 10, shafts 17, 14, 15 and 16 are a gear set; shafts 20, 18, 19 and 21 are a gear set; shafts 23, 22, 24 and 25 are a gear set). In each gear set, the driving wheel on the input shaft meshes with the driven wheel on each output shaft. The central lines of the input shafts and output shafts which belong to the same gear set all adopt triangular pyramid arrangements. In consideration of the symmetrical appearance and manufacturing art, the central line of any one of the second-stage output shafts is vertical. Each gear set is provided with three second-stage output shafts and altogether nine second-stage output shafts are provided.

In addition, three output shafts in the second-stage transmission extend according to the axial direction and are also the output shafts in the second-stage transmission. The number of the input shafts in the second-stage transmission (3 input shafts) is equal to the number of the output shaft in the first-stage transmission (3 input shafts); the number of the output shafts in the second-stage transmission (12 input shafts) is equal to the sum of the edges of the polygonal pyramid arrangement of the input shafts in the second-stage transmission (9 input shafts) plus the number of the input shafts in the second-stage transmission (3 input shafts).

This shows that the designed two stages of transmissions of the double-stage polyhedral space curve mesh transmission shown in the figures all only adopt triangular pyramid arrangements and can realize twelve outputs of variable speeds under the circumference of single input shaft. Moreover the polygonal pyramid arrangement of the polyhedral space curve mesh transmission is not limited to the triangular pyramid arrangement, and more single input-multiple outputs structures can be designed.

Figure 13:
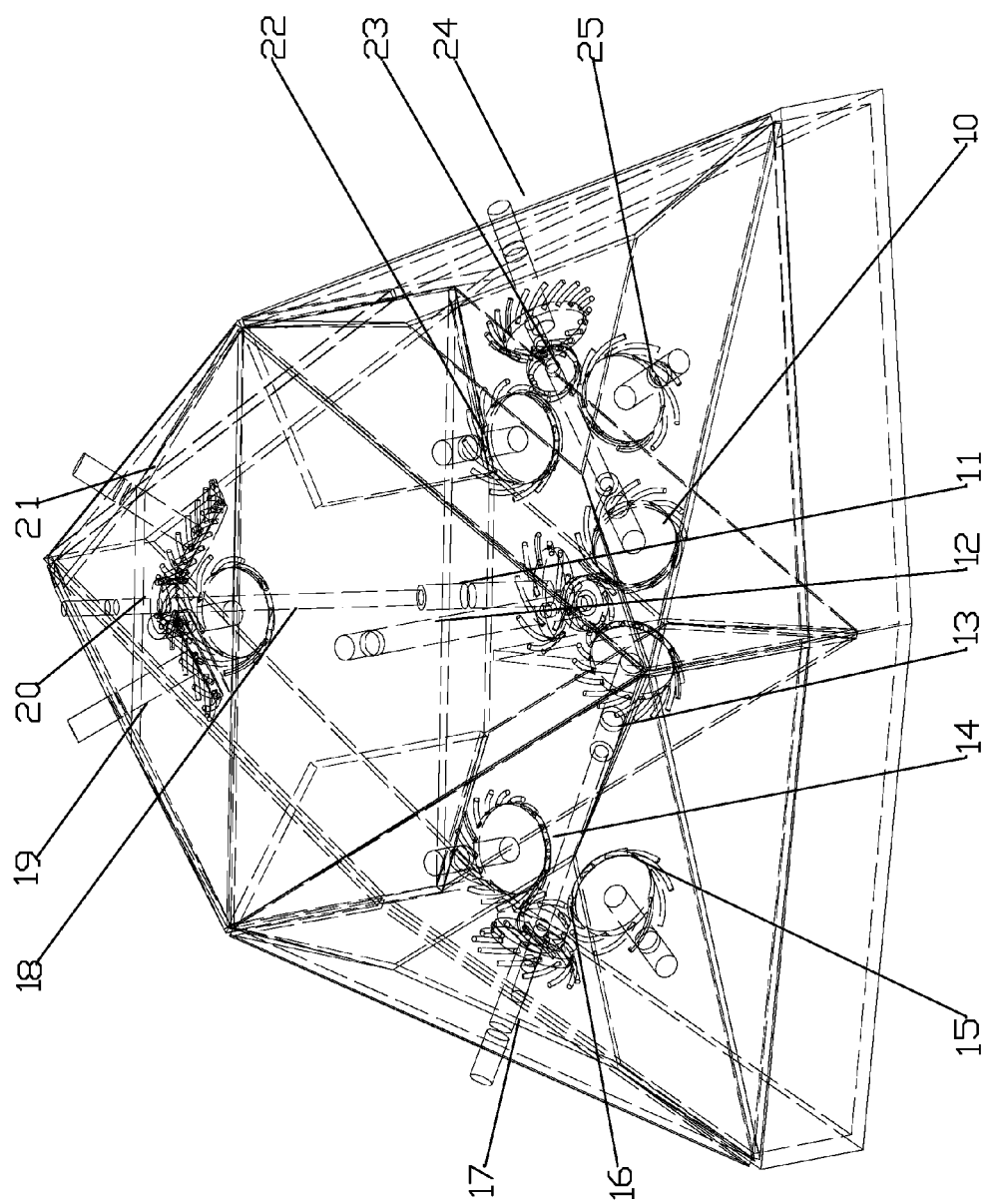
FIG. 13 is a perspective view of the structure of the second stage polyhedral space curve mesh transmission shown in FIG. 12.

A perspective view of the double-stage polyhedral space curve mesh transmission shown in FIG. 12 is shown in FIG. 13. The upper box body and the lower box body form an airtight shell to play a role of supporting and fixing to all input shafts and output shafts. Corresponding to the stage number of the transmission, the upper box of the double-stage polyhedral space curve mesh transmission is divided into two layers. The upper box body and the lower box body are provided with holes in accordance with the positions and outer diameters of all of the input shafts and output shafts. Components (driving wheel, driven wheel, shafts, box body etc.) are manufactured are assembled and debugged in accordance with specified precisions after being manufactured so as to obtain a double-stage polyhedral space curve mesh transmission.

What is claimed is:

1. A space curve mesh driving pair, consisting of a driving wheel and a driven wheel, wherein axes of the driving wheel and the driven wheel are intersected at an angle of 0°~180° other than 90°, the driving wheel is connected with an input shaft, the driven wheel is connected an output shaft, and power transmission is realized by continuous mesh between driving tines and driven tines;

central lines of said driving tines are helical curves in a three dimensional space, and central lines of the driven tines are conjugate with the central lines of the driving tines;

equations of the central lines of said driven tines and the central lines of said driving tines are determined by following method:

in two space Cartesian coordinate systems of o-x,y,z and $o_p$-$x_p$,$y_p$,$z_p$, O is an origin of the coordinate system o-x,y,z ,$O_p$ is an origin of the coordinate system $o_p$-$x_p$, $y_p$,$z_p$; axis z overlaps with the axis of the driving wheel, axis $z_p$ overlaps with the axis of the driven wheel, plane xoz and plane $x_p o_p z_p$ are in a same plane; an included angle between plane $x_p o_p y_p$ and plane x o y is θ, and 0°≤θ≤180°; an distance from point $O_p$ to axis z is a, an distance to axis x is b; space Cartesian coordinate system $o_1$-$x_1$,$y_1$,$z_1$ is fixedly connected with the driving wheel, space Cartesian coordinate system $o_2$-$x_2$,$y_2$,$z_2$ is fixedly connected with the driven wheel, they overlap with the coordinate system o-x,y,z and $o_p$-$x_p$,$y_p$,$z_p$ at an original position; the driving wheel rotates at a uniform angular velocity $\omega_1$ around axis z, the driven wheel rotates at a uniform angular velocity $\omega_2$ around axis $z_p$; after a period of time from the original position, the coordinate systems $o_1$-$x_1$,$y_1$,$z_1$ and $o_2$-$x_2$,$y_2$,$z_2$ rotate respectively, at this moment the driving wheel turns angle $\phi_1$ around axis z, the driven wheel turns angle $\phi_2$ around axis $z_p$;

space curve equations of the central lines of the driving tines and the driven tines is expressed as:

$$\begin{cases} \left[-\sin\phi_1\left(x_1 - \frac{D}{2}\beta_{x1}\right) + \cos\phi_1\left(y_1 - \frac{D}{2}\beta_{y1}\right)\right](\omega_1 - \omega_2\cos\theta) \\ (\cos\phi_1\beta_{x1} + \sin\phi_1\beta_{y1}) + \left\{\omega_2\left[\sin\theta\left(z_1 - \frac{D}{2}\beta_{z1} - b\right) + \right.\right. \\ \left.\cos\theta\left[\cos\phi_1\left(x_1 - \frac{D}{2}\beta_{x1}\right) + \sin\phi_1\left(y_1 - \frac{D}{2}\beta_{y1}\right) + a\right]\right] - \\ \left.\omega_1\left[\cos\phi_1\left(x_1 - \frac{D}{2}\beta_{x1}\right) + \sin\phi_1\left(y_1 - \frac{D}{2}\beta_{y1}\right)\right]\right\} \\ (-\sin\phi_1\beta_{x1} + \cos\phi_1\beta_{y1}) + \omega_2\sin\theta \\ \left[-\sin\phi_1\left(x_1 - \frac{D}{2}\beta_{x1}\right) + \cos\phi_1\left(y_1 - \frac{D}{2}\beta_{y1}\right)\right]\beta_{z1} = 0 \\ x_1 = x_1(t) \\ y_1 = y_1(t) \\ z_1 = z_1(t) \\ x_2 = (-\cos\phi_1\cos\phi_2\cos\theta - \sin\phi_1\sin\phi_2)(x_1 - D\beta_{x1}) + \\ (-\sin\phi_1\cos\phi_2\cos\theta + \cos\phi_1\sin\phi_2)(y_1 - D\beta_{y1}) - \\ \cos\phi_2\sin\theta(z_1 - D\beta_{z1}) + \cos\phi_2(b\sin\theta - a\cos\theta) \\ y_2 = (\cos\phi_1\sin\phi_2 - \sin\phi_1\cos\phi_2)(x_1 - D\beta_{x1}) + \\ (\sin\phi_1\sin\phi_2\cos\theta + \cos\phi_1\sin\phi_2)(y_1 - D\beta_{y1}) + \\ \sin\phi_2\sin\theta(z_1 - D\beta_{z1}) - \sin\phi_2(b\sin\theta - a\cos\theta) \\ z_2 = \cos\phi_1\sin\theta(x_1 - D\beta_{x1}) + \sin\phi_1\sin\theta(y_1 - D\beta_{y1}) - \\ \cos\theta(z_1 - D\beta_{z1}) + a\sin\theta + b\cos\theta \\ \omega_2 = i_{21}\omega_1 \\ \phi_2 = i_{21}\phi_1 \end{cases}$$

wherein formula:

$$\left[-\sin\phi_1\left(x_1 - \frac{D}{2}\beta_{x1}\right) + \cos\phi_1\left(y_1 - \frac{D}{2}\beta_{y1}\right)\right](\omega_1 - \omega_2\cos\theta)$$
$$(\cos\phi_1\beta_{x1} + \sin\phi_1\beta_{y1}) + \left\{\omega_2\left[\sin\theta\left(z_1 - \frac{D}{2} - b\right) + \right.\right.$$
$$\cos\theta\left[\cos\phi_1\left(x_1 - \frac{D}{2}\beta_{x1}\right) + \sin\phi_1\left(y_1 - \frac{D}{2}\beta_{y1}\right) + a\right]\right] -$$
$$\left.\omega_1\left[\cos\phi_1\left(x_1 - \frac{D}{2}\beta_{x1}\right) + \sin\phi_1\left(y_1 - \frac{D}{2}\beta_{y1}\right)\right]\right\}$$
$$(-\sin\phi_1\beta_{x1} + \cos\phi_1\beta_{y1}) -$$
$$\omega_2\sin\theta\left[-\sin\phi_1\left(x_1 - \frac{D}{2}\beta_{x1}\right) + \cos\phi_1\left(y_1 - \frac{D}{2}\beta_{y1}\right)\right]\beta_{z1} = 0$$

is a mesh equation of the space conjugate curve;

$r_1 = x_1(t)i_1 + y_1(t)j_1 + z_1(t)k_1$ is a radius vector expression of the central lines of the driving tines;

$$\begin{cases} x_1 = x_1(t) \\ y_1 = y_1(t) \\ z_1 = z_1(t) \end{cases}$$

is expressions of the space curve equations of the central lines of the driving tines; t is a parameter, and $-\pi < t$, end point value of t is determined by the mesh equation of the space conjugate curve;

$\beta_1$ is an unit principal normal vector of a mesh point, namely $\beta_1 = \beta_{x1}i_1 + \beta_{y1}j_1 + \beta_{z1}k_1$, $i_1, j_1, k_1$ are respectively unit vectors of each coordinate axis, $\beta_{x1}$, $\beta_{y1}$, $\beta_{z1}$ are magnitudes of the unit principal normal vector $\beta_1$ at each of the $x_1$, $y_1$, $z_1$ coordinate axis component,
wherein:

$$\beta_{x1} = \frac{x_1''(t)[x_1'^2(t) + y_1'^2(t) + z_1'^2(t)] - x_1'(t)\dfrac{[x_1'(t)x_1''(t) + y_1'(t)y_1''(t) + z_1'(t)z_1''(t)]}{}}{\nabla [x_1'^2(t) + y_1'^2(t) + z_1'^2(t)]^2}$$

$$\beta_{y1} = \frac{y_1''(t)[x_1'^2(t) + y_1'^2(t) + z_1'^2(t)] - y_1'(t)\dfrac{[x_1'(t)x_1''(t) + y_1'(t)y_1''(t) + z_1'(t)z_1''(t)]}{}}{\nabla [x_1'^2(t) + y_1'^2(t) + z_1'^2(t)]^2}$$

$$\beta_{z1} = \frac{z_1''(t)[x_1'^2(t) + y_1'^2(t) + z_1'^2(t)] - z_1'(t)\dfrac{[x_1'(t)x_1''(t) + y_1'(t)y_1''(t) + z_1'(t)z_1''(t)]}{}}{\nabla [x_1'^2(t) + y_1'^2(t) + z_1'^2(t)]^2}$$

$$\nabla = |\ddot{r}_1| = \left|\frac{d^2 r_1}{ds^2}\right|,$$

$r_1$ is a radius vector of the central line of the driving tines, s is an arc length of the curve of the central line;
the space curve equations of the central line of the driven tines conjugate with the central lines of the driving tines are:

$$\begin{cases} x_2 = (-\cos\phi_1\cos\phi_2\cos\theta - \sin\phi_1\sin\phi_2)(x_1 - D\beta_{x1}) + \\ (-\sin\phi_1\cos\phi_2\cos\theta + \cos\phi_1\sin\phi_2)(y_1 - D\beta_{y1}) - \cos\phi_2\sin\theta(z_1 - D\beta_{z1}) + \\ \cos\phi_2(b\sin\theta - a\cos\theta) \\ y_2 = (\cos\phi_1\sin\phi_2 - \sin\phi_1\cos\phi_2)(x_1 - D\beta_{x1}) + \\ (\sin\phi_1\sin\phi_2\cos\theta + \cos\phi_1\sin\phi_2)(y_1 - D\beta_{y1}) + \sin\phi_2\sin\theta(z_1 - D\beta_{z1}) - \\ \sin\phi_2(b\sin\theta - a\cos\theta) \\ z_2 = \cos\phi_1\sin\theta(x_1 - D\beta_{x1}) + \sin\phi_1\sin\theta(y_1 - D\beta_{y1}) - \cos\theta(z_1 - D\beta_{z1}) + \\ a\sin\theta + b\cos\theta \end{cases}$$

in the equation:
θ—an included angle between plane $x_p o_p y_p$ and plane x o y, also an supplementary angle of an included angle between the axes of the driving wheel and the driven wheel, with range of 0°~180°; a, b—a distance from point $O_p$ to axis z is a, a>0; a distance from point $O_p$ to axis x is b, b >0; $\omega_1$, $\omega_2$—angular velocities of the driving wheel and the driven wheel respectively; $i_{12}$—angular velocity ratio of the driving wheel and the driven wheel, namely a ratio of number of the driven tines and number of the driving tines; $i_{21}$—reciprocal of $i_{12}$, angular velocity ratio of the driven wheel and the driving wheel, namely a ratio of the number of the driving tines and the number of the driven tines; D—a diameter of the driving tines and the driven tines;
when the space curve equations of the central lines of the driving tines and values of a, b, D, $i_{12}$, θ are determined, the space curve equations of conjugate central lines of the driven tines are also determined so as to obtain a set of space curve mesh driving pair.

2. The space curve mesh driving pair according to claim 1, wherein a number of driving tines are provided on said driving wheel, and a number of driven tines are provided on the driven wheel;
the driving tines are uniformly arranged on an end face of a cylinder of the driving wheel, and the driven tines are uniformly arranged on the circumference of a cylindrical surface of the driven wheel;
the driving wheel and the driven wheel form a driving pair, when the driving wheel rotates, the driving tines mesh with the driven tines to realize the transmission between intersecting axes in a three dimensional space.

3. The space curve mesh driving pair according to claim 1, wherein one of the driving tines meshes with one of the driven tines, and when said one driving tine is being separated from said one driven tine while they are not completely separated from each other, another driving tine begins to mesh with another driven tine, so as to allow the space curve mesh driving pair to realize a continuous and stable mesh transmission.

4. A polyhedral space curve mesh transmission device, wherein a driving pair in said transmission device is the space curve mesh driving pair according to claim 1; said transmission device comprises an upper box body, a lower box body, an input shaft and multiple output shafts installed on the upper box body and lower box body;
the transmission device is a polyhedral space curve mesh transmission device with N transmission stage, wherein N is an integer greater than or equal to 1, while K is any integer greater than or equal to 2 and smaller than or equal to N;
each transmission stage of the transmission device comprises at least one gear set, each gear set comprising one input shaft, one driving wheel, multiple output shafts and multiple driven wheels according to claim 1, wherein each input shaft is connected with one driving wheel, axis of the driving wheel overlapping with axis of the input shaft, and each output shaft is connected with one driven wheel, axis of the driven wheel overlapping with axis of the output shaft;
in one gear set, the driving wheel on the input shaft meshes with the driven wheel on the output shaft via driving tines and driven tines, and axes of the input shaft and all the output shafts are arranged in a regular polygonal pyramid shaped construction, with axes of all the output shafts concurrent in a three dimensional space, angles between axes of two adjacent output shafts being the same, and axes of the output shafts being axially symmetrical distributed about axis of the input shaft;
$1^{st}$ stage of the transmission device comprises one gear set;
the input shaft of each gear set in $K^{th}$ stage is independently coaxially connected with the output shaft of the gear set in $(K-1)^{th}$ stage such that the input shaft and the corresponding output shaft move at a same angular velocity;
each gear set in $(K-1)^{th}$ stage comprises multiple output shafts which are respectively coaxially fixedly connected with the input shaft of each gear set in the $K^{th}$ stage such that the output shaft and the corresponding input shaft move at a same angular velocity;
the input shaft of each gear set in the $K^{th}$ stage is extended in its axial direction and this input shaft also acts as an output shaft in the $K^{th}$ stage; number of the input shafts in the $K^{th}$ stage is equal to number of the output shafts in the $(K-1)^{th}$ stage, while number of the output shafts in the $K^{th}$ stage is equal to sum of number of edges of said polygonal pyramid in the $K^{th}$ stage and number of the input shafts in the $K^{th}$ stage.

5. The polyhedral space curve mesh transmission device according to claim 4, wherein the upper box body and the lower box body form a closed housing, and the upper box body and the lower box body are provided with holes for installing said input shafts and output shafts.

* * * * *